(12) United States Patent
Lauer et al.

(10) Patent No.: US 7,230,220 B2
(45) Date of Patent: Jun. 12, 2007

(54) METHOD OF DETERMINING OPTICAL PROPERTIES AND PROJECTION EXPOSURE SYSTEM COMPRISING A WAVEFRONT DETECTION SYSTEM

(75) Inventors: Steffen Lauer, Aalen (DE); Ulrich Wegmann, Koenigsbrunn (DE); Wolfgang Emer, Aalen (DE); Harald Sakowski, Lauchheim (DE); Martin Schriever, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 65 days.

(21) Appl. No.: 11/387,945

(22) Filed: Mar. 24, 2006

(65) Prior Publication Data

US 2006/0231731 A1  Oct. 19, 2006

Related U.S. Application Data

(63) Continuation of application No. PCT/EP2003/010720, filed on Sep. 26, 2003.

(51) Int. Cl.
*G01J 1/20* (2006.01)
*G03B 27/74* (2006.01)

(52) U.S. Cl. .............. 250/201.9; 356/512; 355/68
(58) Field of Classification Search ......... 250/201.9, 250/548; 356/512–515; 355/67, 68
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,296,892 A | 3/1994 | Mori | |
| 5,335,059 A | 8/1994 | Maruyuma et al. | |
| 5,523,193 A | 6/1996 | Nelson | |
| 5,577,092 A | 11/1996 | Kublak et al. | |
| 5,631,721 A | 5/1997 | Stanton et al. | |
| 5,710,620 A | 1/1998 | Taniguchi | |
| 5,724,122 A | 3/1998 | Oskotsky | |
| 5,828,455 A | 10/1998 | Smith et al. | |
| 5,926,257 A | 7/1999 | Mizouchi | |
| 6,285,443 B1 | 9/2001 | Wangler et al. | |
| 6,307,682 B1 | 10/2001 | Hoffman et al. | |
| 6,344,898 B1 | 2/2002 | Gemma et al. | |

(Continued)

FOREIGN PATENT DOCUMENTS

| | | |
|---|---|---|
| EP | 1387220 | 2/2004 |
| WO | WO 02/42728 | 5/2002 |

*Primary Examiner*—Thanh X. Luu
*Assistant Examiner*—Stephen Yam
(74) *Attorney, Agent, or Firm*—Jones Day

(57) ABSTRACT

A method of determining at least one optical property of a projection exposure system is described, wherein the exposure system includes a beam delivery system having a light source for generating an exposure optical beam having light of a first wavelength ($\lambda_1$) and a second wavelength ($\lambda_2$), wherein a first ratio is defined as an intensity of light $\lambda_2$ to an intensity of light $\lambda_1$ in the exposure optical beam. The method includes supplying at least one measuring optical beam including light of at least $\lambda_1$ to the projection optical system, detecting wavefronts having traversed the projection optical system, and determining an optical property in dependence of the detected wavefronts, wherein a second ratio of an intensity of light of $\lambda_2$ to an intensity of light of $\lambda_1$ in the measuring optical beam being incident on the detector of the wavefront detection system is less than the first ratio.

26 Claims, 9 Drawing Sheets

U.S. PATENT DOCUMENTS

| | | | |
|---|---|---|---|
| 6,661,522 B2* | 12/2003 | Ouchi | 356/515 |
| 6,829,039 B2* | 12/2004 | Endo et al. | 355/53 |
| 2001/0055103 A1 | 12/2001 | Nishi | |
| 2002/0001088 A1 | 1/2002 | Wegmann et al. | |
| 2002/0159048 A1 | 10/2002 | Inoue et al. | |
| 2003/0090627 A1 | 5/2003 | Hirohara et al. | |
| 2003/0128368 A1 | 7/2003 | Kuchel | |
| 2004/0095662 A1 | 5/2004 | Masaki et al. | |

* cited by examiner

METHOD OF DETERMINING OPTICAL PROPERTIES AND PROJECTION EXPOSURE SYSTEM COMPRISING A WAVEFRONT DETECTION SYSTEM

This application is a continuation of International Patent Application No. PCT/EP2003/010720 filed Sep. 26, 2003, which was published in English by the International Bureau, the entire contents of which are incorporated herein by reference.

BACKGROUND OF THE INVENTION

1. Field of the Invention

The present invention generally relates to a method of determining optical properties in a projection exposure system and a projection exposure system comprising a wavefront detection system. In particular, the present invention relates to the determination of optical parameters from one or more wavefronts in a projection exposure system wherein light of more than one wavelength is used for exposure.

2. Brief Description of Related Art

Lithographic processes are commonly used in the manufacture of semiconductor elements, such as integrated circuits (ICs), LSIs, liquid crystal elements, micropatterned members and micromechanical components.

A projection exposure apparatus used for photolithography generally comprises an illumination optical system with a light source and a projection optical system. Light from the illumination optical system illuminates a reticle (mask) having a given pattern and the projection optical system transfers an image of the reticle pattern onto a photosensitive substrate. The image of the reticle pattern may also be reduced in size by the projection optical system so as to produce a smaller image of the reticle pattern on the substrate.

The trend towards ever more sophisticated semiconductor devices requires semiconductor elements of smaller size and higher complexity which, in turn, makes higher demands on the optical performance achievable with projection exposure systems. In particular, the image of the reticle pattern needs to be very accurately projected onto the substrate. Therefore, for instance, aberrations of the wavefronts of the light transferring the image of the reticle pattern onto the substrate need be to reduced to the greatest extent possible.

Various methods and systems are known which allow to alter the optical performance of the projection exposure systems after assembly of the various components comprised in the projection exposure system. For instance, one or more lenses can be tilted or moved along an optical axis of the system to reduce certain types of aberrations, such as astigmatism. After assembly and optimisation, the optical performance of a projection exposure system may undergo a change induced by a variation in atmospheric conditions of the environment the projection exposure system is exposed to, for example. The optical performance of the projection exposure system may also change over time.

In order to be able to optimise the optical performance of a projection exposure system and make adjustment(s) thereto, optical properties of the projection optical system need to be accurately determined.

Various methods of determining optical properties in a projection exposure system and detection systems for detecting these properties are known. Amongst those, the most preferable are those which allow for in-situ measurements of the optical properties in the projection exposure system and do not require significant alteration of the projection exposure system. In-situ measurements thus increase ease of use and time-efficiency of the projection exposure system.

Among the commonly employed wavefront detecting techniques is the Shack-Hartmann-technique. This technique involves splitting a wavefront in a pupil plane of the projection optical system into a plurality of portions and measuring a gradient of each split wavefront portion. Thus, an aberration of the split portion and an aberration of the whole wavefront can be determined. An example of a wavefront detecting method using the Shack-Hartmann-technique is described in US 2002/0159048 A1, for instance, the entire content of which is incorporated by reference herein. Alternatively, the classical Hartmann test technique may be used for measuring wavefront profiles.

Other wavefront detection methods known in the art are based on interferometric techniques. Point diffraction interferometry, Twyman-Green interferometry, Fizeau interferometry, or shearing interferometry methods may be used, for instance.

U.S. Pat. No. 5,828,455, the entire content of which is included by reference herein, describes a method and apparatus for analysing a wavefront at a multiplicity of field points over an entire lens train. The method is based on the finding that upon irradiating a reticle, spots are created at an image plane of the projection optical system which are deviated from their diffraction-limited positions, which deviation can be measured. The method includes using an aperture plate consisting of a multiplicity of openings with each opening being centred underneath a neighbourhood of points accepted into an entrance pupil of an imaging objective. Points traversing through all openings will produce a number of spot arrays in a substrate plane. The totality of all the arrays of spots whose centroids can be measured and reconstructed yields an aberrated wavefront at a number of discrete field points. Thus, an in-situ interferometric analysis of a wavefront having traversed the projection optical system in a projection exposure system is provided.

In US 2002/0001088 A1 a method and apparatus for detecting wavefronts by shearing interferometry are disclosed, the entire content of which is incorporated by reference herein.

U.S. Pat. No. 6,344,898 discloses a point diffraction interferometer for measuring a test surface by detecting the state of interference fringes generated by interference of a reference light beam that interacts with the test surface. The reference and measurement beams are produced by a point light source. In WO 02/42728, a method and apparatus for measuring an aberration of a projection optical system are described which are based on point diffraction interferometry. The entire contents of both referenced documents are incorporated herein by reference.

Wavefront detection techniques for in-situ determination of optical properties require a wavefront source and, hence, a light source. Generally, for reasons of ease of use, a beam generated by the light source comprised in the projection exposure system will be used both in an exposure mode for exposing a substrate and a measurement mode for detecting a wavefront and determining optical properties in the projection optical system.

With projection exposure systems being developed for ever smaller wavelengths, among the light sources currently used or being envisaged for use are excimer lasers such as ArF lasers (193 nm) and KrF lasers (248 nm) as well as $F_2$-lasers (157 nm), which emit light in the ultraviolet range. In addition, the development goes towards use of light sources emitting light in the extreme ultraviolet end (EUV) of the spectrum, such as plasma sources.

The range of wavelengths of light emitted by the various light sources differs largely. While lasers are usually adapted to emit substantially monochromatic light, i.e. emit light of one wavelength having a small spectral bandwidth, plasma sources used in EUV projection exposure systems tend to emit a broad band of wavelengths. In view of the requirements of the projection exposure system in terms of accurate projection of an image of the reticle pattern onto the substrate, the light source will have to fulfil certain specifications in terms of feasible spectral bandwidths and wavelengths.

However, whilst the transition to smaller wavelengths has been well accommodated in terms of a quality achievable in an exposure mode, results from wavefront detection techniques measuring at the wavelength of exposure have been found to be unsatisfactory.

SUMMARY OF THE INVENTION

Therefore, there is a need for a method of detecting wavefronts and a projection exposure system comprising a wavefront detection system capable of improving the quality of the wavefront detection and an accuracy of the determination of optical properties in dependence of the detected wavefront when detection is carried out at the wavelength of the exposure.

In a first embodiment, the present invention provides a method of determining optical properties of a projection exposure system, the projection exposure system comprising: a beam delivery system for supplying an exposure optical beam for illuminating a patterning structure, wherein the beam delivery system comprises a light source generating the exposure optical beam having light of a first wavelength and of at least a second wavelength different from the first wavelength, wherein a first ratio is defined as an intensity of light of the second wavelength in the exposure optical beam to an intensity of light of the first wavelength in the exposure optical beam; and a projection optical system for imaging the patterning structure onto a photosensitive substrate; wherein the method comprises: supplying at least one measuring optical beam to the projection optical system, the at least one measuring optical beam comprising light of at least the first wavelength having wavefronts; detecting wavefronts of the at least one measuring optical beam having traversed the projection optical system and determining the optical properties in dependence of the detected wavefronts; and wherein a second ratio of an intensity of light of the second wavelength in the at least one measuring optical beam having traversed the projection optical system and being incident on a detector of a wavefront detection system to an intensity of light of the first wavelength in the at least one measuring optical beam having traversed the projection optical system and being incident on the detector of the wavefront detection system is less than the first ratio.

For a wavelength of light to be regarded as different from the first wavelength, a difference between the first wavelength and the other wavelength may be as small as 0.01 nm. A wavelength will be deemed different in the context of the present invention if it adversely interferes with at least one of detection of a wavefront and determination of optical properties in dependence of the detected wavefront. The two wavelengths may be separate, discrete emission bands, part of separate, discrete emission bands, or may be part of the same continuous emission band, depending on the emission characteristics of the light source.

Optical properties, such as aberrations, of the projection exposure system serve to characterise an imaging performance of the projection exposure system. For instance, Zernike coefficients which characterise certain kinds of aberrations can be determined from wavefront measurements.

The beam delivery used in embodiments of the present invention may be any beam delivery system known in the art. For instance, the beam delivery system may be one as described in U.S. Pat. No. 6,285,443, the entire content of which is incorporated herein by reference. The beam delivery system described therein comprises, in the direction of the beam travelling through the beam delivery system: a light source, a beam expander, a first diffractive optical element, an objective, a second diffractive optical element, an in-coupling optic, a glass rod, a reticle masking system, and an additional objective comprising several lens elements and a mirror before the reticle plane. The beam expander magnifies a cross-section of a laser beam generated by the laser light source. The first diffractive optical element defines an object plane having an exit pupil in which the second diffractive optical element is provided. The objective in between the two diffractive optical elements may be a zoom element. The in-coupling optic transfers light exiting from the second diffractive optical element to an entry face of the glass rod which serves to mix and homogenise the light. The reticle masking system is positioned in an intermediate field plane directly at an exit face of the glass rod, with the reticle masking system defining an adjustable field diaphragm. The objective then images the intermediate field plane of the reticle masking system onto the reticle.

A vast range of illumination systems comprising different optical components, such as, for instance, fly eye's lenses or arrays of optical elements as integrators, is known, which would also be suitable for use with embodiments of the present invention. Such illumination systems are disclosed, for instance, in U.S. Pat. No. 5,631,721, U.S. Pat. No. 6,307,682, U.S. Pat. No. 5,296,892, U.S. Pat. No. 5,724,122, U.S. Pat. No. 5,926,257, U.S. Pat. No. 5,710,620 and US Application No. 2001/0055103, the entire contents of which are incorporated by reference herein.

The light source used in embodiments according to the present invention may be any light source generating light of more than one wavelength. Light sources generally used in projection exposure apparatus are particularly preferred. Such light sources comprise thermal light-sources, excimer lasers such as ArF-, KrF- or $F_2$-lasers as well as plasma sources for the generation of EUV-light. A method and apparatus for producing extreme ultraviolet light is disclosed, for instance, in U.S. Pat. No. 5,577,092, the entire content of which is incorporated herein by reference. In addition, synchrotron radiation sources or X-ray sources may be used for the generation of EUV light. As used herein, the term "light source" is meant to encompass also those embodiments, where more than one light source make up the light source of the illumination optical system, such as when two lasers are used as a light source.

The term "patterning structure" as used herein refers broadly to any device suited for endowing an illuminating light beam with a patterned cross-section, an image of which pattern (of the illuminated patterning structure) is projected onto the substrate. The patterning structure may be a mask or a reticle, for example. The term "reticle" is more generally associated with a mask a reduced image of which is projected onto the substrate, and the term "mask" generally refers to a non-reducing, i.e. 1:1 projection exposure. Mask or reticle types include binary, attenuating and alternating phase shift types, and various hybrid types. The mask/reticle may transmit or reflect the illumination light beam whilst imparting a patterned cross-section upon it. Programmable mirror arrays are further examples of patterning structures suitable for use with the present invention. One example of such an array is described, for instance, in U.S. Pat. No. 5,296,891, the entire content of which is incorporated by reference herein. An active, matrix-addressable surface light modulator is provided with a reflective surface whose individually addressed surface areas reflect incident light as diffracted light and whose non-addressed surface areas reflect light as undiffracted light. Undiffracted light is then filtered out, and only the diffracted light is permitted to propagate to a projection lens (projection optical system). Thus, the matrix-addressable surface matrix is programmed to impart a desired pattern to the illumination light beam. An additional example of a programmable mirror array is disclosed in U.S. Pat. No. 5,523,193, the entire content of which is incorporated by reference herein. Illumination light strikes a spatial light modulator comprising a plurality of programmable mirror devices or pixels, which are electronically actuated to a defined position thus creating a pattern from which the illumination light beam is reflected towards the substrate or projection optical system, respectively or into an off position. Programmable LCD arrays are further examples of patterning structures suitable for use with embodiments according to the present invention. Such an array is disclosed in U.S. Pat. No. 5,229,872, for instance, the entire content of which is incorporated by reference herein. An illumination light beam is reflected from a face of a liquid crystal light valve having a reflective pattern of an image (reproduced from a cathode ray tube screen) and is directed through a projection optical system towards a substrate. Generally, light valves or illumination templates are additional terms used in connection with patterning structures.

Regarding projection optical systems suitable for use with embodiments according to the present invention, any projection optical system known in the art may be used, comprising dioptric, catadioptric and catoptric designs of projection optical systems.

Detection of wavefronts may be carried out by any known method. Interferometric methods or methods using a Hartmann-Shack or Hartmann-type sensor may be used, for instance. A number of detection methods has been described and incorporated by reference herein in the section "background of the invention". The method of detection of wavefronts will largely determine the way the measuring optical beam is supplied. Generally, the measuring optical beam will have predetermined wavefronts, i.e. the wavefronts are generated in a predetermined way without necessarily having a defined and known shape.

In addition to point diffraction interferometry, shearing interferometry, Hartmann-style wavefront sensing, the Hartmann-Shack technique, also the Foucault method and the Ronchi test, both well known in the art, may be used for measuring wavefronts in embodiments according to the present invention Generally, the ratio of the intensities of light of the different wavelengths in the exposure optical beam will have to fall within a predetermined range in order for the projection exposure system to provide optimum or at least minimally impaired optical performance in an exposure mode. For instance, if a $F_2$-laser is used for generation of the exposure optical beam, which emits light of a first wavelength (e.g. 157.63 nm) having a large intensity and light of a second wavelength (e.g. 157.52 nm) having a small intensity, the ratio of the intensity of light of the second wavelength to the intensity of light of the first wavelength would generally be adapted to have a value below about 1:200 in order for light of the second wavelength not to adversely affect the optical performance of the projection exposure system.

It has, however, been found that standard methods of generating data for optical properties from wavefront detection methods yield poor results when the measuring optical beam and, hence, the exposure optical beam comprises light of more than one wavelength.

In shearing interferometry, for instance, if the measuring optical beam comprises light of a first wavelength having a high intensity and light of a second wavelength having a small intensity, such as in the light emitted by a $F_2$-laser, the resulting interferogram is an incoherent superposition of a first interferogram attributable to light of the first wavelength and a second interferogram attributable to light of the second wavelength. Reconstructing a wavefront from the incoherently superposed interferograms and subsequent determination of optical properties from the reconstructed wavefront therefore yields inaccurate results which comprise a systematic error. This systematic error may be larger than an acceptable total value of the respective optical property.

It has been found that, at least for the range of intensity ratios of light of the second wavelength and light of the first wavelength typically occurring in measuring optical beams, the systematic error scales with the inverted intensity ratio of light of the second wavelength to light of the first wavelength.

In order to eliminate or at least reduce errors associated with the use of light comprising more than one wavelength from wavefront detection, reconstruction and subsequent determination of optical properties, a first embodiment of the present invention provides a method of determining optical properties wherein in the at least one measuring optical beam having traversed the projection optical system and being incident on the detector of the wavefront detection system the second ratio of the intensity of light of the second wavelength to the intensity of light of the first wavelength is less than the first ratio which defines the intensity of light of the second wavelength relative to the intensity of light of the first wavelength in the exposure optical beam.

In other words, according to the first embodiment, the ratio of the intensity of light of the second wavelength to the intensity of light of the first wavelength is smaller in the measuring optical beam having traversed the projection optical system and being incident on the detector of the wavefront detection system than in the exposure optical beam. Thus, an influence associated with light of the second wavelength on the wavefront detection is reduced so as to increase an accuracy of wavefront detection, reconstruction and determination of optical properties.

According to the first embodiment of the present invention, having a second ratio in the measuring optical beam having traversed the projection optical system and being incident on the detector of the wavefront detection system smaller than the first ratio in the exposure optical beam may be achieved by a variety of methods/means.

In an example of the first embodiment of the present invention, this may be achieved by using a first light source for generating the exposure optical beam and using a second light source different from the first light source to generate at least one measuring optical beam. This could be accomplished by replacing the (first) light source in the illumination optical system for a (second) light source emitting light of the first wavelength only for use in a measuring mode of the projection exposure system.

In the first embodiment of the present invention, the at least one measuring optical beam may be generated from an optical beam generated by the light source used to generate the exposure optical beam, for instance from the exposure optical beam. In order to impart desired properties (such as wavefronts and/or shape) to the (at least one) supplied measuring optical beam before it traverses the projection optical system, the optical beam used to supply the at least one measuring optical beam may traverse one or more arrangements, such as aperture plates or particular reticles, depending on the wavefront detection method used. In case shearing interferometry is used for detection, for instance, the optical beam generally traverses a pinhole mask to supply at least one measuring optical beam.

In those embodiments where an exposure optical beam, i.e. an optical beam generally used in an exposure mode (having the first ratio), is used in the supply of the at least one measuring optical beam, the intensity of light of the second wavelength is decreased relative to the intensity of light of the first wavelength in at least one of the exposure optical beam and the measuring optical beam (by appropriate means) such that the second ratio in the measuring optical beam having traversed the projection optical system and being incident on the detector of the wavefront detection system is smaller than the first ratio in the exposure optical beam.

In one example of the first embodiment, a third ratio of an intensity of light of the second wavelength in the at least one supplied measuring optical beam to an intensity of light of the first wavelength in the at least one supplied measuring optical beam is less than the first ratio. Thus, the measuring optical beam has a third ratio before traversing the projection optical system and a second ratio after traversing the projection optical system and being incident on the detector of the wavefront detection system. The third ratio may be substantially the same as the second ratio or may be different from the second ratio. For example, a difference between the second and the third ratio may be merely due to a loss of light intensity attributable to the projection optical system itself wherein a loss of light having the first wavelength may be different from a loss of intensity of light having the second wavelength. The loss of light intensity may be due to decreased transmissivity of one or more optical members of the projection optical system, to light absorption by a gas present in between optical members of the projection optical system or other factors.

In an example of the method according to the first embodiment, supplying the at least one measuring optical beam generated from the optical beam, which has been generated by the light source used to generate the exposure optical beam, to the projection optical system comprises modifying the beam delivery system.

Thus, for instance, the optical beam generated by the light source may be either adapted or already supplied such that the at least one supplied measuring optical beam has the third ratio, without the need for actively further adapting the ratio of an intensity of the first wavelength to an intensity of light of the second wavelength once the at least one measuring optical beam has been supplied to the projection optical system (leaving changes of intensity caused by the projection optical system itself aside).

In further examples of the first embodiment of the present invention, modifying the beam delivery system comprises modifying the light source.

For instance, modifying the light source may comprise suppressing at least one of generation and amplification of light of the second wavelength.

If the light source is a laser, suppression of at least one of generation and amplification of light of the second wavelength may be achieved by increasing an efficiency of a laser resonator of the laser, for example. An increase in efficiency of the laser resonator generally results in improved monochromaticity of the laser beam exiting from the light source.

In the first embodiment of the present invention, the efficiency of the laser resonator may be increased by positioning a prism in the optical path of the light beam within the laser, for instance, wherein the prism deflects light of the first wavelength and light of a second wavelength to different degrees. Whilst in this example, the first wavelength is reflected back upon itself to interfere constructively, the prism and the mirrors are arranged such that the intensity of light of the second wavelength is decreased, at least relative to the intensity of light of the first wavelength.

Modifying the beam delivery system may comprise filtering the light generated by the light source, which is most preferably the exposure optical beam (meaning the light source is not modified as compared to an exposure mode), for example. Thus, the third ratio results.

Filtering the light generated by the light source can be carried out by a variety of different means/methods. Filtering the light generally involves decreasing the intensity of light of the second wavelength so as to increase monochromaticity of the light beam. Any method/means which allows to decrease the intensity of light of the second wavelength relative to the intensity of light of the first wavelength is suitable for use with the present invention. As an example, diffraction gratings may be used.

An exemplary means for filtering the light generated by the light source is a resonator. Resonators suitable for use with the present invention comprise resonant cavities, in particular Fabry-Perot etalons.

Modifying the beam delivery system may comprise introducing an etalon into the beam delivery system, in particular positioning an etalon in a path of the light beam generated by the light source, by way of example. In those exemplary embodiments, the etalon may be positioned in the immediate vicinity of the light source.

In those exemplary embodiments wherein the beam delivery system is modified by way of introduction of an etalon into the beam delivery system, the etalon is generally adapted to increase the monochromaticity of the exposure optical beam, i.e. decrease the intensity of light of the second wavelength relative to the intensity of light of the first wavelength.

In an alternative example of the first embodiment of the present invention, modifying the beam delivery system by filtering the light generated by the light source comprises separating a beam path of the generated light of the first wavelength from a beam path of the generated light of the second wavelength, and blocking off the separated beam path of the light of the second wavelength.

An exemplary arrangement of optical elements suitable for the above method of filtering comprises a number of prisms having different refractive indices for light of the first wavelength and light of the second wavelength as well as a beam stop. In this exemplary arrangement, the prisms are arranged such that a beam path of light of a first wavelength and a beam path of light of the second wavelength are separated. The beam stop would be arranged such that the beam of light of the second wavelength is blocked off once it is sufficiently separated from the beam of light of the first wavelength.

The method according to the first embodiment, may comprise filtering of the at least one measuring optical beam having traversed the projection optical system, for instance. Thus, the second ratio would result.

In further exemplary first embodiments, an etalon is positioned in between the projection optical system and detection means for detecting wavefronts of the at least one measuring optical beam having traversed the projection optical system. However, other means for filtering light suitable for use with the method of the present invention may be used. In further exemplary embodiments, the etalon or other filtering means is part of the wavefront detection system.

According to the first embodiment of the present invention wavefronts of light of the first wavelength only will be incident on the detector thus eliminating or at least substantially decreasing a detrimental influence that one or more wavelengths of light other than the first wavelength may have on the detection and reconstruction of the wavefront as well as the determination of optical properties.

A second embodiment according to the present invention provides a method of determining optical properties of a projection exposure system, the projection exposure system comprising: a beam delivery system for supplying an exposure optical beam for illuminating a patterning structure, wherein the beam delivery system comprises a light source generating light of a first wavelength and of at least a second wavelength different from the first wavelength, wherein a first ratio is defined as an intensity of light of the second wavelength in the exposure optical beam to an intensity of light of the first wavelength in the exposure optical beam; and a projection optical system for imaging the patterning structure onto a photosensitive substrate; wherein the method comprises: supplying at least one measuring optical beam to the projection optical system, the at least one measuring optical beam comprising light of the first wavelength and at least the second wavelength having wavefronts; detecting wavefronts of the at least one measuring optical beam having traversed the projection optical system and determining the optical properties in dependence of the detected wavefronts; and wherein detecting and determining includes correcting for contributions of the light of the second wavelength.

In the second embodiment, detection of wavefronts may comprise detection of a first light pattern generated from the at least one measuring optical beam having traversed the projection optical system, wherein the correction includes determining a second light pattern generated by light of the second wavelength, for example.

In further examples of the second embodiment, determining the second light pattern generated by light of the second wavelength comprises:

determining a contribution of light of the second wavelength to a light pattern, preferably an interferogram, at a given intensity of light of the second wavelength, which is termed a systematic wavefront-fingerprint, and determining an absolute intensity of light of the second wavelength in the exposure optical beam generating the at least one measuring optical beam and, based on the systematic fingerprint and the intensity of light of the second wavelength in the exposure optical beam reconstructing the second light pattern.

For instance a portion of the exposure optical beam can be separated off a beam path in the beam delivery system by a beam splitter and the separated portion of the exposure optical beam would then be measured spectrometrically in order to determine intensities of light of the first and second wavelength in the exposure optical beam. Based on the intensity of light of the second wavelength and the systematic fingerprint, the second light pattern is reconstructed and corrected for in the first light pattern. Thus, a wavefront associated with light of the first wavelength only can be reconstructed and an accurate determination of optical properties from the reconstructed wavefront carried out.

In a further example, the detection of wavefronts comprises detecting a (first) light pattern generated from the at least one measuring optical beam having traversed the projection optical system, and determining an approximation of the optical property from the detected pattern, and correcting the approximation of the optical property.

Determining an approximation of the optical property from the detected pattern and correcting the approximation of the optical property may comprise in an example:

determining an approximation of the respective optical property at a number of different ratios of light of the second wavelength to light of the first wavelength wherein a spectral property of light of the first wavelength is kept constant in order to obtain a calibration graph, wherein the approximation of the property (on the y-axis) is plotted against the different ratios (on the x-axis), extrapolating a curve fitted to the approximations at the different ratios in the calibration graph to a zero value of the ratio of light of the second wavelength to light of the first wavelength and taking the value at the intercept of the extrapolated curve and the y-axis as the systematic error of the respective optical property which is subtracted from the approximation of the optical property so as to obtain a corrected optical property.

Suitable light sources, beam delivery systems, projection optical systems and wavefront detection techniques have already been described above in connection with the first embodiment of the present invention.

A further embodiment of the present invention further provides a method of aligning a projection exposure system comprising: determining optical properties of the projection exposure system according to the method of the present invention (in a first or second aspect), and adjusting a configuration and alignment of the projection exposure system in dependence of the determined properties.

In addition, an embodiment of the present invention provides a projection exposure system aligned according to the above method of aligning a projection exposure system.

In a further embodiment, the present invention provides a projection exposure system comprising: a beam delivery system for supplying an exposure optical beam for illuminating a patterning structure, wherein the beam delivery system comprises a light source generating light of a first wavelength and of at least a second wavelength different from the first wavelength, wherein a first ratio is defined as an intensity of light of the second wavelength in the exposure optical beam to an intensity of light of the first wavelength in the exposure optical beam; a projection optical system for imaging the patterning structure onto a photosensitive substrate; and a wavefront detection system having a detector for detecting light from the light source having traversed the projection optical system, a filter for reducing the first ratio wherein the filter is positioned or positionable in a beam path between the light source and the detector.

The filter may be positioned or positionable between the light source and the projection optical system, for instance.

In an alternative example, the filter is positioned or positionable between the projection optical system and the detector. The filter may be positioned in between the projection optical system and the wavefront detection system or may be part of the wavefront detection system, for instance.

The wavefront detection system may comprise a Hartmann-like sensor system, such as a Hartmann-Shack sensor system.

In examples, the wavefront detection system comprises an interferometer system. The interferometer system may comprise a shearing interferometer or a point diffraction interferometer, for example.

The embodiment of the projection exposure system may further comprise a system for positioning the filter in the beam path and for removing the filter from the beam path. The system may comprise a turret mechanism, a slideable carriage or other means known to the person skilled in the art.

The filter may be positioned in the beam path in a measuring mode and removed from the beam path in an exposure mode, i.e. a mode when projection exposures are carried out, for example.

Suitable light sources, beam delivery systems, projection optical systems, wavefront detection techniques and filters and methods of filtering have been described above in connection with the first embodiment of the present invention. Since the embodiment of the projection exposure system of the present invention may be used in connection with the first embodiment, the same considerations and advantages described above with regard to the relevant examples of the first embodiment of the present invention equally apply to the embodiment of the projection exposure system according to the present invention.

Whilst in the embodiments referred to above and examples thereof, an intensity of light of a second wavelength is decreased relative to an intensity of light of the first wavelength, it will be appreciated by those skilled in the art that more wavelengths than the second wavelength may be filtered out of at least one of the exposure optical beam and the measuring optical beam should this at least one additional wavelength adversely interfere with at least one of wavefront detection and determination of optical properties in dependence of the detected wavefront. The same considerations apply to the second embodiment of the present invention and examples thereof which may comprise correction for light of wavelengths in addition to the second wavelength.

A further embodiment of the present invention provides a method of manufacturing a miniaturised device comprising: providing a photosensitive substrate, aligning the photosensitive substrate in a projection exposure system according to the third aspect of the present invention, and imaging a patterning structure onto the photosensitive substrate for exposing the photosensitive substrate.

In addition, a yet further embodiment of the present invention provides a miniaturised device manufactured according to the above method of manufacturing a miniaturised device.

BRIEF DESCRIPTION OF THE DRAWINGS

The foregoing as well as other advantageous features of the invention will be more apparent from the following detailed description of exemplary embodiments of the invention with reference to the accompanying drawings. It is noted that not all possible embodiments of the present invention necessarily exhibit each and every, or any, of the advantages identified herein.

DETAILED DESCRIPTION OF EXEMPLARY EMBODIMENTS

Figure 1:
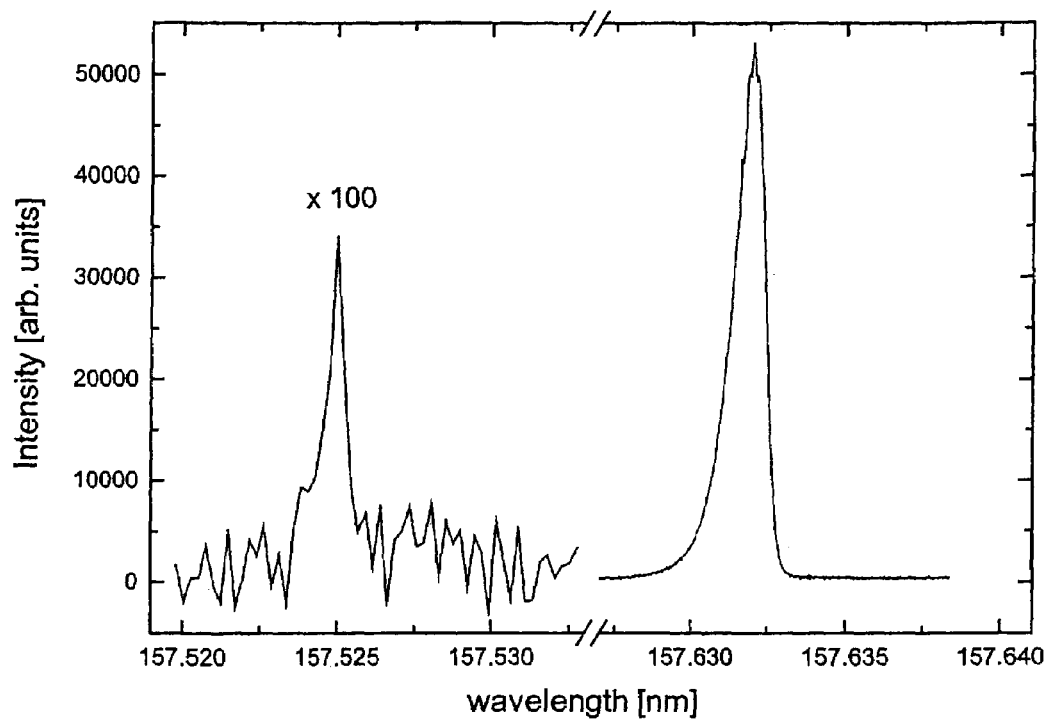
FIG. 1 depicts a spectrum of light emitted by a $F_2$-laser.

In FIG. 1, the emission spectrum of a $F_2$-laser as typically used in a projection exposure apparatus is depicted. As can be seen from the spectrum, the laser emits light of two discrete wavelengths and two different intensities. A first laser line comprises light of 157.63 nm wavelength, the first wavelength $\lambda_1$, and a relative intensity of about 0.993, the first intensity $I_1$. A second laser line comprises light of 157.52 nm wavelength, the second wavelength $\lambda_2$, and a relative intensity of about 0.007, the second intensity $I_2$. It is to be noted that these values, i.e. wavelengths and ratio of the relative intensities, are dependent on the operating conditions of the laser, such as pressure and nature of a buffer gas within the laser. The difference between the first and second wavelength, however, remains constant. The Figure also shows the small asymmetric spectral bandwidth of the first line.

When this laser is used as a light source in a projection exposure apparatus, light of the second wavelength $\lambda_2$ in the exposure optical beam will be subject to such large chromatic aberrations in the projection optical system that the light of the second wavelength incident on the photosensitive substrate is so diffuse that only a contrast of the projected image is reduced without any additional errors, such as broadening of imaged lines, occurring. However, when this laser is used to generate measuring optical beams in a shearing interferometric determination of wavefronts having traversed the projection optical system, for instance, systematic errors in the optical properties calculated on the basis of the determined wavefronts result. Some of those errors may be as large as several 0.1 nm to 1 nm for certain Zernike coefficients. Errors of this order are intolerably large, in particular in view of the fact that some of the optical properties have to fall within a specified range of values, the maximum value of some of which is only half the value of the above-referred systematic error for the respective optical property.

Figure 2A:
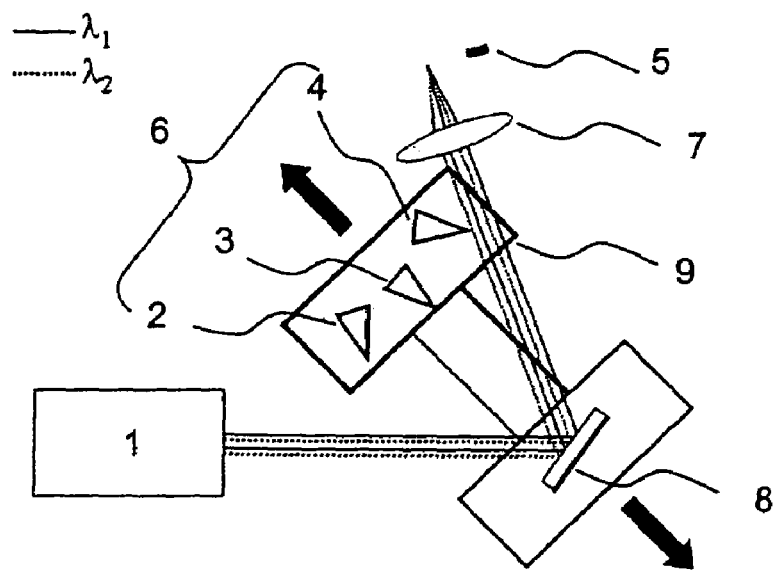
FIG. 2 schematically shows an embodiment of the present invention with a filter comprising a beam stop for light of the second wavelength, a: with the filter removed from the beam path and b: with the filter positioned in the beam path.
Figure 2B:
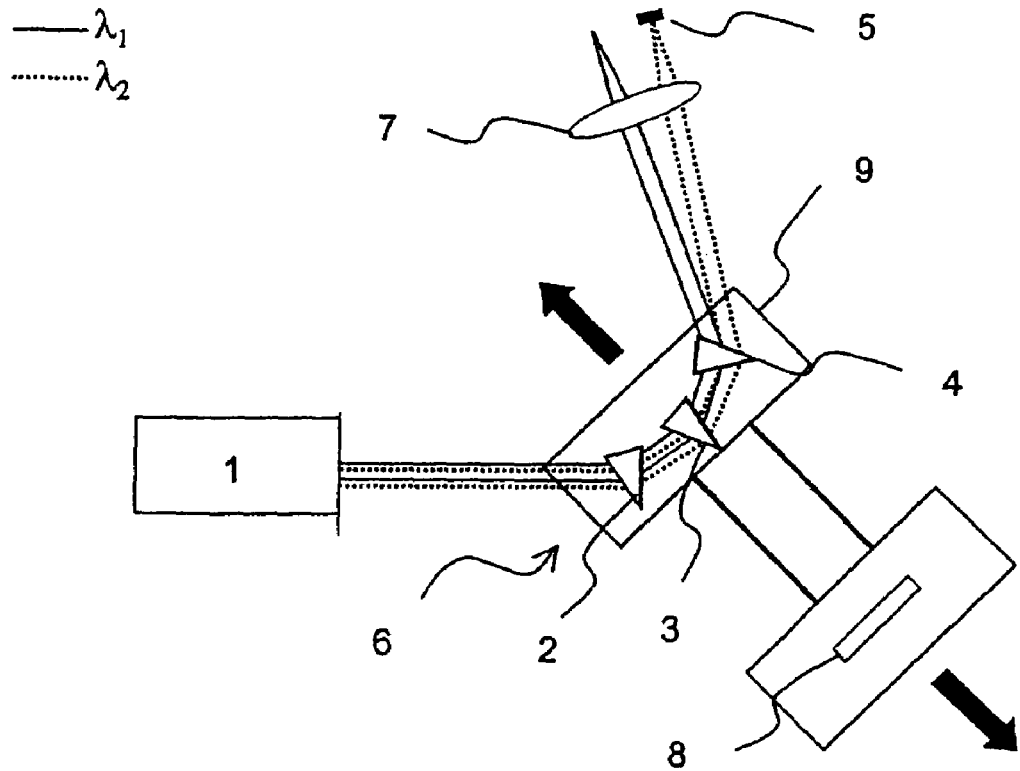

In FIGS. 2a and 2b, a first exemplary embodiment of the present invention is illustrated. In this first exemplary embodiment, the beam delivery system is modified by a filter 6 for filtering the light generated by the light source 1. More specifically, as depicted in FIG. 2b, three prisms 2, 3, 4 are introduced into a path of the exposure optical beam generated by the light source 1. The three prisms 2, 3, 4 are arranged in such a way that a path of light of the first wavelength $\lambda_1$ and a path of light of the second wavelength $\lambda_2$ are separated. The path of light of the second wavelength $\lambda_2$ deviates from the path of light of the first wavelength $\lambda_1$ more after each pass through a prism 2, 3, 4 until the path is sufficiently separated from the path of light of the first wavelength $\lambda_1$ that the beam of light of the second wavelength can be blocked off by a beamstop 5. Light of the first wavelength $\lambda_1$ is then directed towards the remaining components of the beam delivery system. Thus, the intensity $I_2$ of light of the second wavelength $\lambda_2$ is significantly decreased so that a ratio of intensity $I_2$ of light of the second wavelength $\lambda_2$ to an intensity $I_1$ of light of the first wavelength $\lambda_1$ ($I_2/I_1$) is significantly smaller than the first ratio in an exposure optical beam supplied by the beam delivery system without the modification described above. The ratio $I_2/I_1$ is consequently also sufficiently small in the at least one measuring optical beam generated from the filtered exposure optical beam having a reduced $I_2/I_1$-ratio (whereby the at least one measuring beam is supplied with a third ratio).

In the first exemplary embodiment, filter 6 comprising prisms 2, 3 and 4 is provided on a first end of a moveable sledge 9. On a second end of moveable sledge 9, a mirror 8 is mounted. Moveable sledge 9 allows the mirror 8 to be positioned in the path of the exposure optical beam when the projection exposure system is used in an exposure mode, such that the exposure optical beam is deflected towards collimating lens 7 without changing the intensity $I_2$ of light of the second wavelength $\lambda_2$. Thus, moveable sledge 9 facilitates alternation between a measuring mode in which filter 6 is inserted in the path of the exposure optical beam and the exposure mode. Whilst in this first embodiment, beamstop 5 is positioned after collimating lens 7 (in the direction light travels in), beamstop 5 may also be positioned before collimating lens 7. Furthermore, other means for replacing filter 6 with means for directing the exposure optical beam towards the remaining components of the beam delivery system may be used.

As can be derived from FIG. 2, the path of light of the first wavelength is not a straight path in this exemplary embodiment. Therefore, the light source would have to be positioned at an angle to the other components of the beam delivery system. A different arrangement of prisms and/or introduction of one or more mirrors, for instance, could be used to construct a straight path which might be advantageous in terms of compatibility with existing projection exposure systems.

Figure 3:
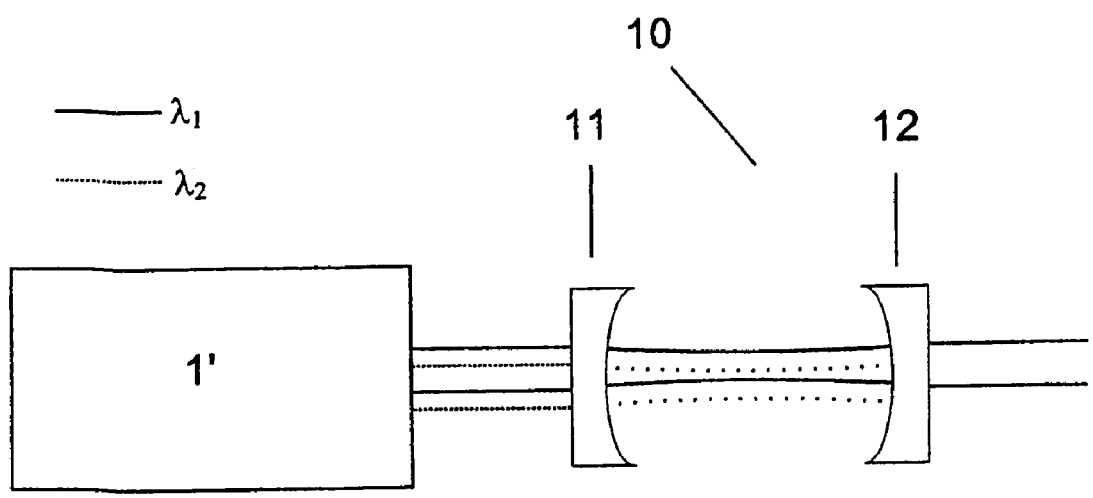
FIG. 3 schematically shows an embodiment of the present invention with an etalon in the beam delivery system.

In FIG. 3, a second exemplary embodiment of the invention is illustrated, wherein an etalon 10 is provided in the beam delivery system in a path of the exposure optical beam generated by the light source 1'. A laser beam of a $F_2$-laser as the light source 1' with properties as described above, which comprises light of the second wavelength $\lambda_2$ having the intensity $I_2$ and light of the first wavelength $\lambda_1$ having the intensity $I_1$ in the first ratio $I_2/I_1$ when exiting from the light source 1' is introduced into an etalon 10 provided in the path of the laser beam in the beam delivery system. The etalon 10 comprises two curved reflective plates 11, 12 defining a cavity, an inside of the plates being spaced apart an integral number of the first wavelength $\lambda_1$. The laser light undergoes multiple reflections in the space between the plates 10, 11 resulting in constructive interference of light of the first wavelength $\lambda_1$ and resulting in destructive interference of light having the second wavelength $\lambda_2$ such that in the beam exiting from the etalon, the ratio $I_2/I_1$ is reduced as compared to (the first ratio) $I_2/I_1$ in the exposure optical beam entering the etalon 10. The beam exiting from the etalon is subsequently used as, or to generate, respectively, the at least one measuring optical beam, for instance by passing it through a perforated mask, as described in connection with the embodiment depicted in FIG. 6. Thus, the at least one measuring optical beam has the ratio $I_2/I_1$ of the beam exiting from the etalon (and is thus supplied having a third ratio).

Figure 4:
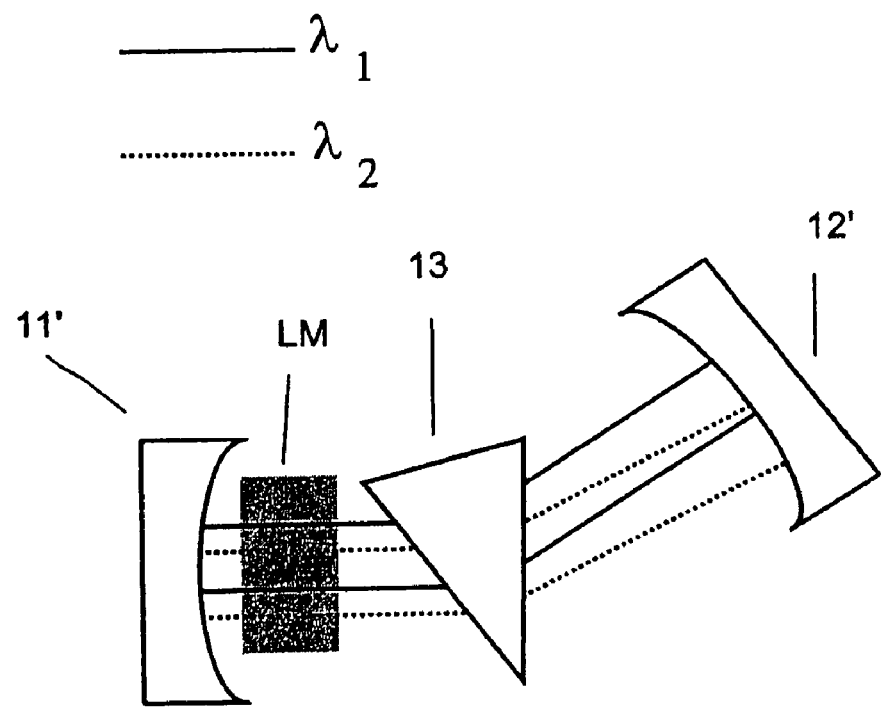
FIG. 4 schematically shows an embodiment of the present invention with a laser resonator of improved quality.

In FIG. 4, an additional exemplary embodiment of the present invention is presented, wherein the beam delivery system is modified by a modification of the light source. As in the exemplary embodiment described above in connection with FIG. 3, a $F_2$-laser is used as the light source. The grey area with the denotation LM indicates the laser medium. The quality of the laser resonator is improved such that the ratio $I_2/I_1$ is reduced as compared to (the first ratio) $I_2/I_1$ in the exposure optical beam used in an exposure mode. In particular, the quality of the laser resonator is increased by introducing a prism 13 into the laser resonator and arranging the two reflective surfaces 11', 12' of the laser resonator such that a beam of light of the first wavelength is reflected between the reflective plates 11', 12' such that constructive interference occurs, whereas the beam of light of the second wavelength is deflected by the prism 13 such that it is not reflected back along the same beam path. Thus, the ratio $I_2/I_1$ is reduced in the beam exiting from the laser resonator as compared to (the first ratio) $I_2/I_1$ in the exposure optical beam used in an exposure mode. The beam exiting from the laser resonator is subsequently used to generate or supply, respectively, the at least one measuring optical beam. Thus, the at least one measuring optical beam has the ratio $I_2/I_1$ of the beam exiting from the laser resonator (and is thus supplied having a third ratio smaller than the first ratio).

Figure 5:
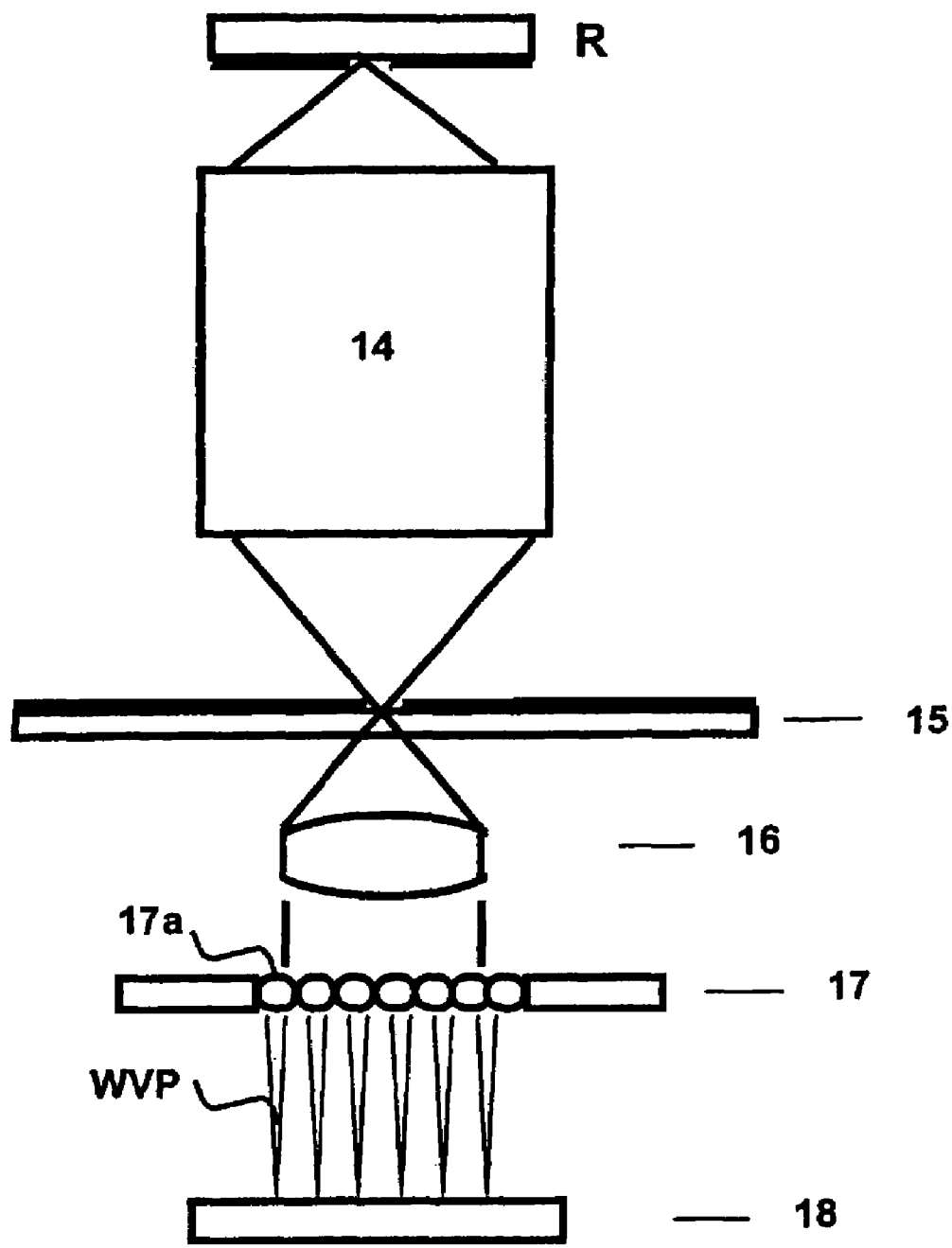
FIG. 5 schematically shows a Shack-Hartmann-type sensor.

In FIG. 5, a Shack-Hartmann-type sensor suitable for use as a wavefront sensor with the exemplary embodiments depicted in FIGS. 2 to 4, for instance, is schematically illustrated. The sensor comprises a reflective reticle mask R, a projection optical system 14, a mark plate 15, a lens system 16 which may comprise a collimator lens and relay lenses (not shown), a micro-lens array 17 with a number of micro-lenses 17a for splitting a wavefront into a plurality of portions WVP and a detector 18, for instance a CCD camera, for detecting wavefronts, or an image thereof, respectively.

Figure 6:
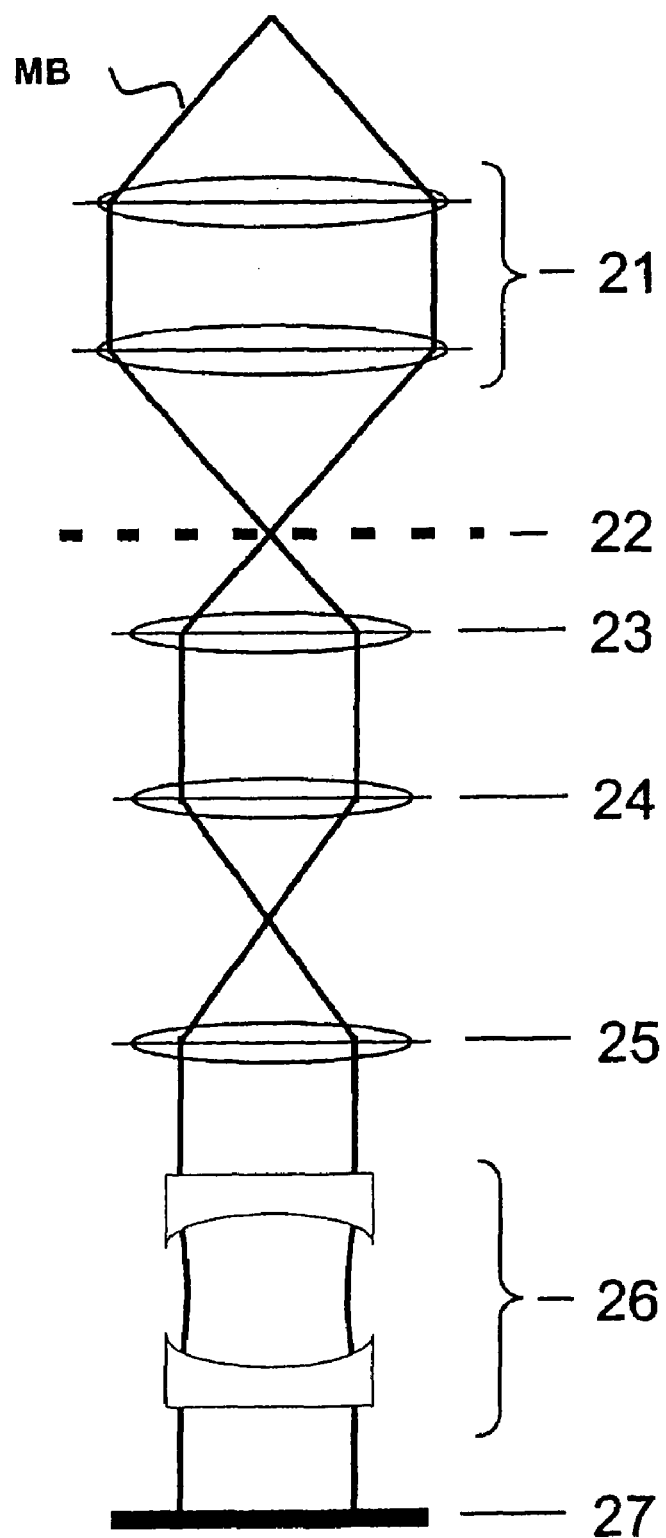
FIG. 6 schematically shows an embodiment of the present invention using shearing interferometry.

FIG. 6 illustrates a further exemplary embodiment of the present invention. The exemplary embodiment comprises a beam delivery system with a light source, which is a $F_2$-laser with the properties described above, and a reticle, neither of which is shown in FIG. 5. The exemplary embodiment of the projection exposure system further comprises a projection optical system 21, an etalon 26 as a filter and a wavefront detection system comprising a diffraction grating 22, a micro objective 23, first and second relay lenses 24, 25 and a detector 27. The wavefront detection system is a shearing interferometer-type wavefront detection system, such as the one described in US 2002/0001088 A1 the entire content of which is incorporated herein by reference. An exposure optical beam with a first ratio of an intensity $I_2$ of light of the second wavelength $\lambda_2$ to an intensity $I_1$ of light of the first wavelength $\lambda_1$ is generated by the laser and supplied by the beam delivery system. The exposure optical beam is incident on a reticle which may be a perforated mask situated in an object plane of the projection exposure system. The reticle acts as a wavefront source for generating at least one measuring optical beam MB having at least one wavefront. The measuring optical beam MB then passes through the projection optical system 21 which may cause a transformation of the wavefronts. The measuring optical beam MB with wavefronts having passed through the projection optical system then passes through the diffraction grating 22 which is positioned in an plane conjugate to the object plane. The diffraction grating 22 is displaced in a predetermined direction causing lateral shearing of the wavefronts. The wavefronts of the light then traverse micro objective 23 and first and second relay lenses 25. Before reaching the detector 27, the light is filtered by the etalon 26 in a way described earlier, so as to decrease the ratio of an intensity $I_2$ of light of the second wavelength $\lambda_2$ to an intensity $I_1$ of light of the first wavelength $\lambda_1$ in relation to the first ratio, resulting in a second ratio. Thus, practically only wavefronts of light of the first wavelength are detected. This allows for accurate determination of optical properties in dependence of the detected wavefront since light of the second wavelength does not significantly contribute to the resulting interferogram.

Figure 7:
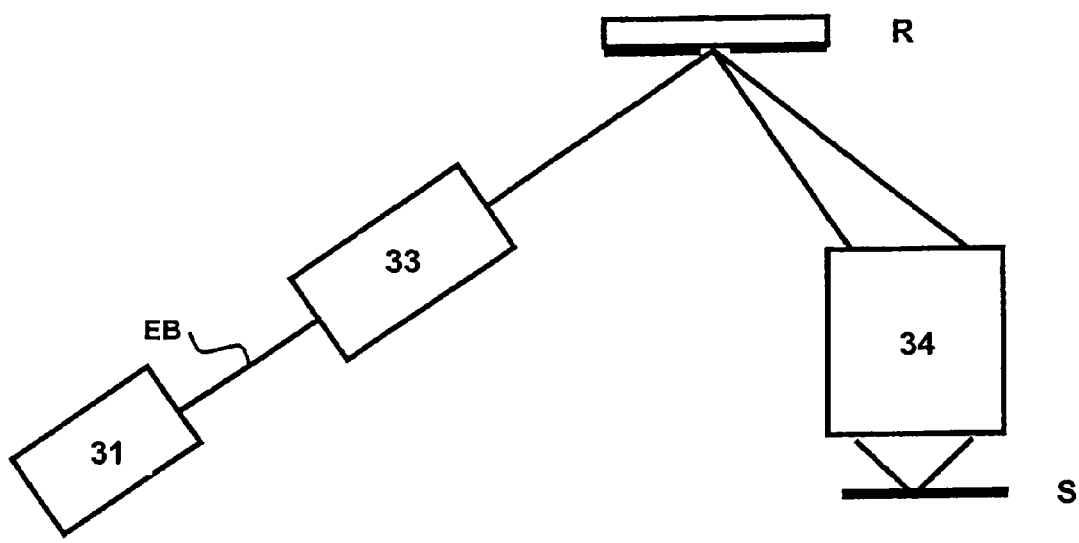
FIG. 7 schematically shows a projection exposure system using EUV-light.

In FIG. 7, a projection exposure apparatus using EUV light for exposing a photo-sensitive substrate is depicted which is suited for use with the present invention. Light source 31 generates EUV light having a spectrum of wavelengths as the exposure optical beam EB. EUV light then passes through an illuminator 33 to a reflective reticle mask R. The EUV light reflected by the reticle R subsequently passes through projection optical system 34, which comprises reflective optical elements, and is then incident on a EUV-sensitive substrate S.

Figure 8:
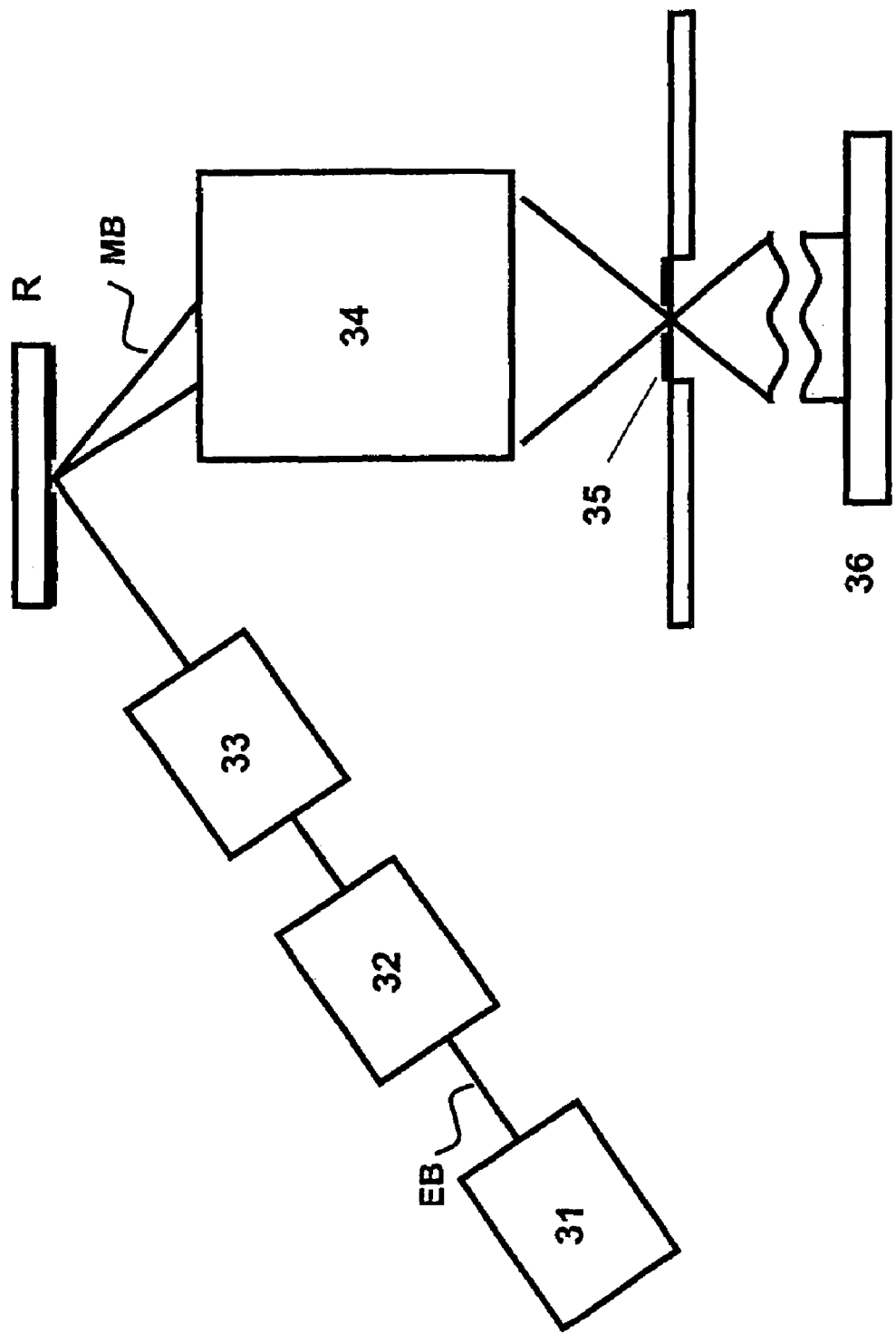
FIG. 8 schematically shows an embodiment of a projection exposure system using EUV-light according to present invention.

FIG. 8 illustrates the projection exposure system of FIG. 7 which has been adapted for in-situ wavefront detection in accordance with the teaching of present invention. In addition to the components denoted in FIG. 7 (with the numbering of identical components being adhered to) the projection exposure system further comprises a wavefront detection system and a filter to increase an intensity of light of a first wavelength relative to an intensity of light of at least one wavelength other than the first wavelength to a level acceptable for determination of optical properties from the detected wavefront. Filter 32 comprises a reflective grating and is positioned in between the light source 31 and the illuminator 33 in the beam delivery system. Thus, the ratio of the first intensity of light of the second wavelength to an intensity of light of the first wavelength in the exposure optical beam EB is reduced by filter 32 such that a third ratio of an intensity of light of the second wavelength to an intensity of light of the first wavelength results in the measuring optical beam MB. A shearing interferometer-type wavefront detection system is provided comprising a membrane with a shearing grating 35 and a spatially resolving detector 36. The method of detecting wavefronts and determining optical properties from the detected wavefronts is in principle the same as the one described earlier in connection with the embodiment depicted in FIG. 6.

According to the second embodiment of the present invention as described before, the detection and determination includes correcting for contributions of the light of at least the second wavelength.

Figure 9:
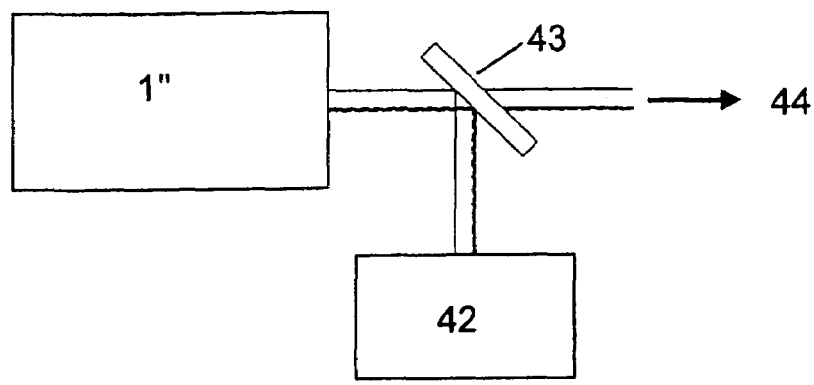
FIG. 9 schematically shows an embodiment of the present invention wherein contributions of the light of the second wavelength are corrected.

In a further exemplary embodiment of the present invention, shearing interferometry is used for wavefront detection. A measuring optical beam generated by the exposure optical beam is supplied and wavefronts having traversed the projection optical system are sheared and detected by a spatially resolving detector as a first light pattern, as described above. Since the light source 1", which is a $F_2$-laser with properties as described above, generates light of a first and a second wavelength, the first light pattern is an incoherent superposition of an interferogram of wavefronts of light having the first wavelength and an interferogram of wavefronts of light having the second wavelength. In order to compensate for errors resulting from determination of optical properties from the superposed interferogram constituting the first light pattern, a second light pattern attributable to light of the second wavelength is determined. This determination comprises measuring an absolute intensity of light of the second wavelength in the exposure optical beam used to generate the at least one measuring optical beam. In order to measure an absolute intensity of light of the second wavelength in the exposure optical beam, a beam splitter 43 is arranged at an angle in a path of the exposure light beam generated by light source 1" such that the exposure light beam is partially deflected orthogonally to the path of the light beam onto a spectrometer 42, as depicted in FIG. 9. At least the intensity of light of the second wavelength in the deflected exposure light beam is measured in the spectrometer 42. The portion of the exposure light beam which is not deflected by the beam splitter 43 passes through the same and propagates in the direction of other components 44 of the beam delivery system. The knowledge of absolute intensity of light of the second wavelength allows the determination of the second light pattern. Using the second light pattern for correction of the first light pattern enables accurate determination of optical properties based on the corrected light pattern.

Figure 10:
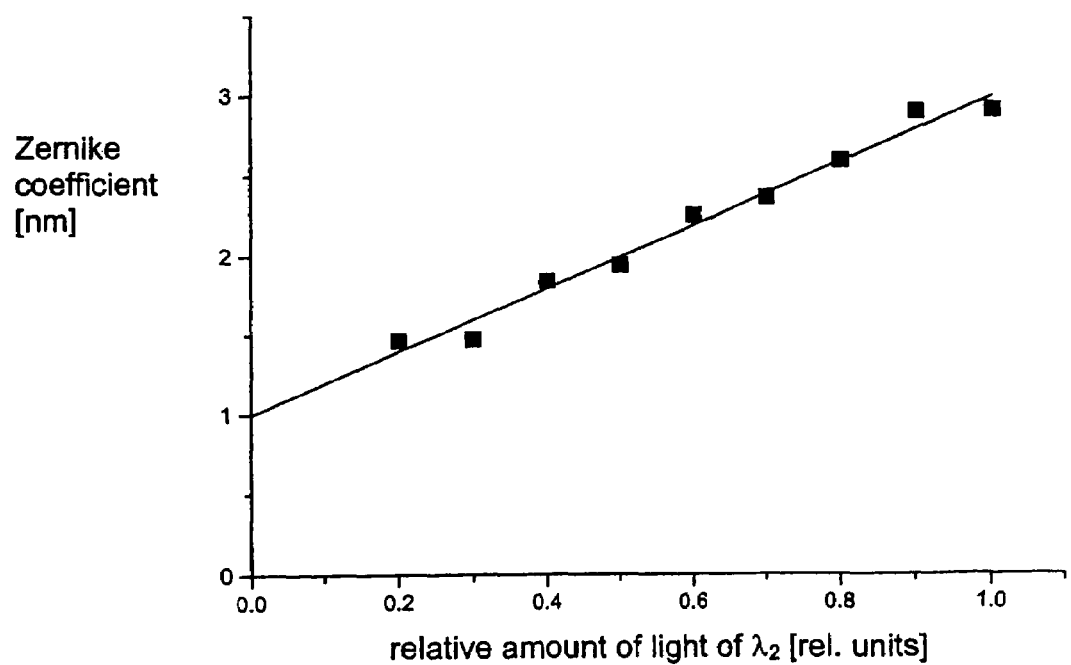
FIG. 10 schematically shows a further embodiment of the present invention wherein contributions of the light of the second wavelength are corrected.

In a further exemplary embodiment, the measuring optical beam comprises light of the first and second wavelengths. Wavefronts of light of both wavelengths or light pattern generated thereby, respectively, are detected by the detector. Therefore, subsequent determination of optical properties from the detected wavefronts does not yield accurate values for the optical properties but rather just approximations thereof. The approximation of the respective optical properties comprises a sum of an accurate value of the respective properties plus a systematic error which is due to a contribution of light of the second wavelength to a detected light pattern. In order to derive the accurate value of the respective optical property from the approximation of the optical property, a calibration curve is generated. In order to obtain the calibration curve, optical properties are determined from wavefronts or light patterns, respectively, of light with different ratios $I_{C_1}$ to $I_{C_2}$ of an intensity of light of the second wavelength to an intensity of light of the first wavelength. As can be seen in FIG. 10, in this exemplary embodiment of the present invention, ratios or relative amounts of light of the second wavelength, respectively, of from 0.2 to 1.0 were set in the exposure optical beam and, hence, the measuring optical beam used to generate light patterns. A Zernike coefficient was calculated from the patterns thus created and plotted against the relative amount of light of the second wavelength. The Zernike coefficients depicted as data points in the calibration curve are approximations of the true value of the Zernike coefficient at the different ratios. The straight line fitted to the experimental data points is extrapolated to the y-axis (denoting the values of the Zernike coefficient) and an intercept of the axis taken as the value of the systematic error of the determination of the respective optical property. Subtracting this systematic error from the approximation of the optical property substantially yields the accurate value for the respective optical property.

Figure 11:
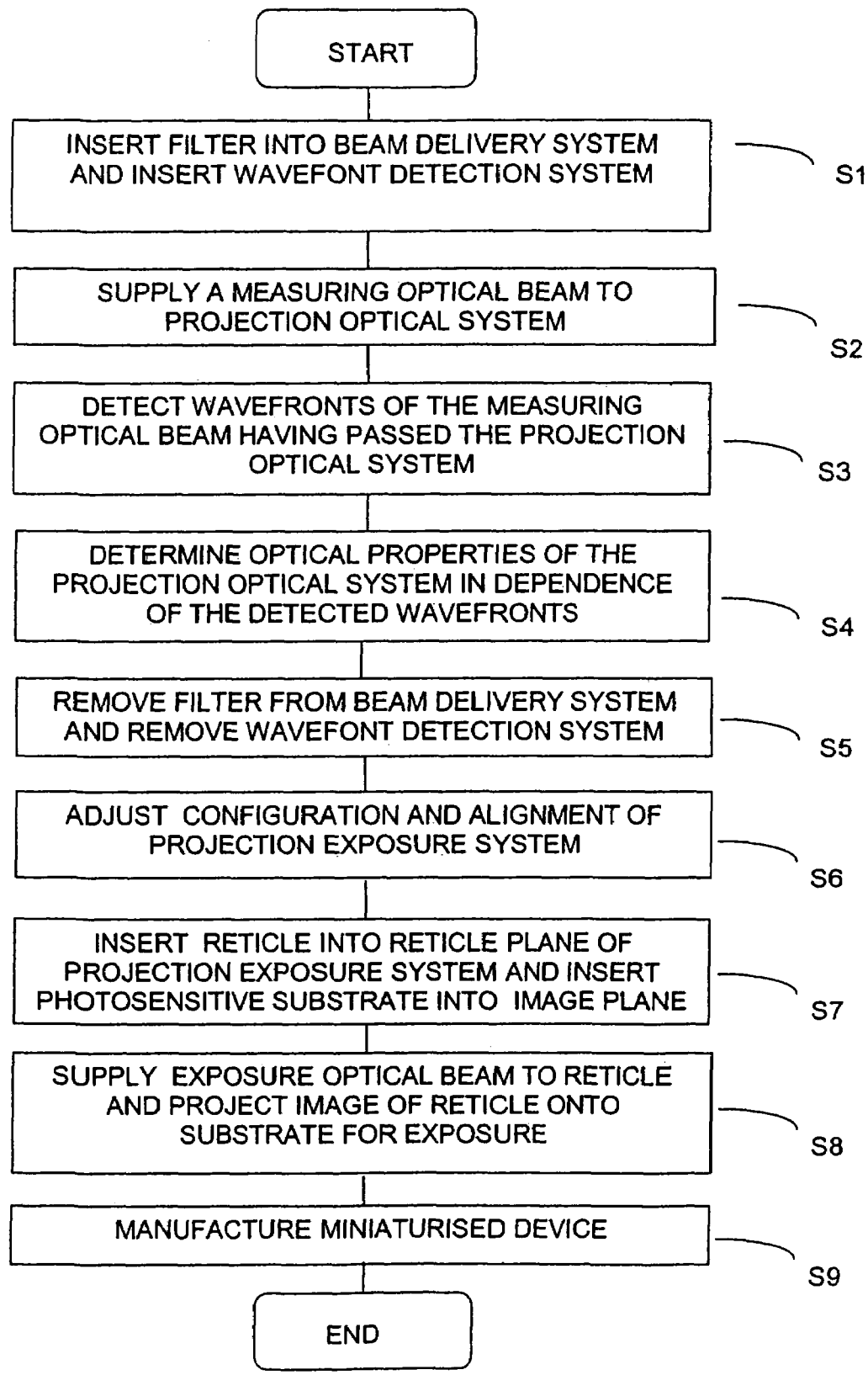
FIG. 11 shows a flow chart of a further exemplary embodiment of the present invention.

FIG. 11 shows a flow chart of an exemplary embodiment of the present invention for manufacturing a miniaturised device. A projection exposure system is provided. The projection exposure system comprises a beam delivery system for supplying an exposure optical beam for illuminating a reticle. The beam delivery system has a light source which generates light of a first wavelength and light of a second wavelength different from the first wavelength having a first ratio, the first ratio defining a ratio of an intensity of light of the second wavelength to an intensity of light of the first wavelength. In a first step (S1), a filter is inserted into the beam delivery system, for instance between the light source and a reticle plane, thus modifying the beam delivery system in order to decrease the (first) ratio of the intensity of light of the second wavelength to the intensity of light of the first wavelength in the beam generated by the light source. Also in the first step (S1), a wavefront detection system is inserted into the projection exposure system. The wavefront detection system may be a shearing interferometer, for instance. In a second step (S2), a measuring optical beam is supplied to the projection optical system, the measuring optical beam having a third ratio of intensity of light of the second wavelength to intensity of light of the first wavelength which is smaller than the first intensity. In this context, it is referred to one measuring optical beam for reasons of simplicity, a plurality of measuring optical beams may also be employed. In case a shearing interferometer is used, the measuring optical beam is generated and supplied by passing the exposure optical beam through the filter inserted in the beam delivery system and subsequently through a patterned pinhole mask located in the reticle plane of the projection exposure system, wherein the supplied measuring optical beam has the third ratio. The measuring optical beam then passes through the projection optical system and wavefronts of the measuring optical beam having traversed the projection optical system are detected in a third step (S3), for instance by shearing interferometry. In a fourth step (S4), optical properties of the projection optical system are determined in dependence of the detected wavefronts. In a fifth step (S5), the filter and the wavefront detection system (including the pinhole mask in the reticle plane) are removed from the projection exposure system. Steps 4 and 5 may also be carried out in reverse order. A configuration and alignment of the projection exposure system, in particular the projection optical system, are then adjusted in a subsequent step (S6). Thus, an imaging performance of the projection exposure system may be improved. A reticle is then inserted in the reticle plane of the projection exposure system and a photosensitive substrate positioned in an image plane of the projection exposure system in a seventh step (S7). An exposure optical beam, having the first ratio, is then supplied to the reticle for illuminating the reticle and an image of the illuminated reticle projected onto the photosensitive substrate by the projection optical system in an eighth step (S8) for exposing the photosensitive substrate. In a ninth step (S9), a miniaturised device is fabricated from the exposed substrate, for instance by developing the exposed photoresist on the substrate, followed by subsequent etching and further manufacturing steps, as common practice in photolithography. Several exposure steps may be carried out, either for exposing different patterns (reticles) or for multiple exposure of the same reticle. A projection exposure system suitable for use in this exemplary embodiment is the one depicted in FIGS. 8 and 9, for instance.

While the invention has been described also with respect to certain specific embodiments thereof, it is evident that many alternatives, modifications and variations will be apparent to those skilled in the art. Accordingly, the preferred embodiments of the invention set forth herein are intended to be illustrative and not limiting in any way. Various changes may be made without departing from the spirit and scope of the present invention as defined in the following claims.

What is claimed is:

1. A method of determining at least one optical property of a projection exposure system, the projection exposure system comprising a beam delivery system for supplying an exposure optical beam for illuminating a patterning structure and comprising a projection optical system for imaging the patterning structure onto a photosensitive substrate, wherein the beam delivery system comprises a light source generating light of a first wavelength and of at least a second wavelength different from the first wavelength, wherein a first ratio is defined as an intensity of light of the second wavelength in the exposure optical beam to an intensity of light of the first wavelength in the exposure optical beam, wherein the method comprises:

supplying at least one measuring optical beam to the projection optical system, the at least one measuring optical beam comprising light of the first wavelength and at least the second wavelength and having wavefronts;

detecting wavefronts of the at least one measuring optical beam having traversed the projection optical system and determining an optical property in dependence of the detected wavefronts; and wherein the detecting and determining includes correcting for contributions of the light of the second wavelength.

2. The method of claim 1, wherein the detecting wavefronts comprises detecting of a first light pattern generated from the at least one measuring optical beam having traversed the projection optical system, and wherein the correcting includes determining a second light pattern generated by light of the second wavelength.

3. The method of claim 1, wherein the detecting wavefronts comprises detecting a first light pattern generated from the at least one measuring optical beam having traversed the projection optical system, and determining an approximation of the optical property from the detected pattern, and correcting the approximation of the optical property.

4. A method of aligning a projection exposure system comprising:

determining at least one optical property of the projection exposure system according to the method of claim 1; and adjusting a configuration and alignment of the projection exposure system in dependence of the determined optical property.

5. A projection exposure system aligned according to the method of claim 4.

6. A method of manufacturing a miniaturised device comprising:

aligning a projection exposure system according to the method of claim 4;

imaging a patterning structure onto the photosensitive substrate using the projection exposure system; and processing the photosensitive substrate to fabricate the miniaturised device.

7. A miniaturised device manufactured according to the method of claim 6.

8. A projection exposure system comprising:
a beam delivery system for supplying an exposure optical beam for illuminating a reticle, wherein the beam delivery system comprises a light source generating light of a first wavelength and of at least a second wavelength different from the first wavelength, wherein a first ratio is defined as an intensity of light of the second wavelength in the exposure optical beam to an intensity of light of the first wavelength in the exposure optical beam;
a projection optical system for imaging the reticle onto a photosensitive substrate; and
a wavefront detection system having a detector for detecting light from the light source having traversed the projection optical system and a filter for reducing the first ratio, wherein the filter is positioned or positionable in a beam path between the light source and the detector.

9. The projection exposure system of claim 8, wherein the filter is positioned or positionable in one of: a space between the light source and the projection optical system and a space between the projection optical system and the detector.

10. The projection exposure system of claim 9, wherein the wavefront detection system comprises a Hartmann-Shack sensor system.

11. The projection exposure system of claim 9, wherein the wavefront detection system comprises a Hartmann-type sensor system.

12. The projection exposure system of claim 9, wherein the wavefront detection system comprises an interferometer system.

13. The projection exposure system of claim 12, wherein the interferometer system comprises a shearing interferometer.

14. The projection exposure system of claim 12, wherein the interferometer system comprises a point diffraction interferometer.

15. The projection exposure system of claim 9, further comprising a system for positioning the filter in the beam path and removing the filter from the beam path.

16. The projection exposure system of claim 9, wherein the system is configured for the filter to be positioned in the beam path in a measuring mode and for the filter to be removed from the beam path in an exposure mode.

17. A method of determining optical properties of a projection exposure system, the projection exposure system comprising a beam delivery system for supplying an exposure optical beam for illuminating a patterning structure and comprising a projection optical system for imaging the patterning structure onto a photosensitive substrate, wherein the beam delivery system comprises a light source generating the exposure optical beam having light of a first wavelength and of at least a second wavelength different from the first wavelength, wherein a first ratio is defined as an intensity of light of the second wavelength in the exposure optical beam to an intensity of light of the first wavelength in the exposure optical beam, wherein the method comprises:

supplying at least one measuring optical beam to the projection optical system, the at least one measuring optical beam comprising light of the first wavelength and having wavefronts; and detecting wavefronts of the at least one measuring optical beam having traversed the projection optical system and determining the optical properties in dependence of the detected wavefronts, wherein a second ratio of an intensity of light of the second wavelength in the at least one measuring optical beam having traversed the projection optical system and being incident on a detector of a wavefront detection system to an intensity of light of the first wavelength in the at least one measuring optical beam having traversed the projection optical system and being incident on the detector of the wavefront detection system is less than the first ratio.

18. The method of claim 17, wherein a third ratio of an intensity of light of the second wavelength in the at least one supplied measuring optical beam to an intensity of light of the first wavelength in the at least one supplied measuring optical beam is less than the first ratio.

19. The method of claim 18, wherein the supplying the at least one measuring optical beam to the projection optical system comprises modifying the beam delivery system.

20. The method of claim 19, wherein the modifying of the beam delivery system comprises modifying the light source.

21. The method of claim 20, wherein the modifying of the light source comprises suppressing at least one of generation and amplification of light of the second wavelength.

22. The method of claim 19, wherein the modifying of the beam delivery system comprises filtering the light generated by the light source such that the third ratio results.

23. The method of claim 22, wherein the filtering comprises separating a beam path of the generated light of the first wavelength from a beam path of the generated light of the second wavelength, and blocking the separated beam path of the light of the second wavelength.

24. The method of claim 17, further comprising filtering the at least one measuring optical beam having traversed the projection optical system.

25. A method of aligning a projection exposure system comprising:
determining at least one optical property of the projection exposure system according to the method of claim 17; and
adjusting a configuration and alignment of the projection exposure system in dependence of the determined optical property.

26. A projection exposure system aligned according to the method of claim 25.

* * * * *